US009095032B2

(12) United States Patent
Lee

(10) Patent No.: US 9,095,032 B2
(45) Date of Patent: Jul. 28, 2015

(54) APPARATUS AND METHOD FOR LASER SEALING

(71) Applicant: SAMSUNG DISPLAY CO., LTD., Yongin, Gyeonggi-Do (KR)

(72) Inventor: Jung-Min Lee, Yongin (KR)

(73) Assignee: Samsung Display Co., Ltd., Yongin-Si (KR)

( * ) Notice: Subject to any disclaimer, the term of this patent is extended or adjusted under 35 U.S.C. 154(b) by 245 days.

(21) Appl. No.: 13/756,418

(22) Filed: Jan. 31, 2013

(65) Prior Publication Data

US 2013/0280981 A1  Oct. 24, 2013

(30) Foreign Application Priority Data

Apr. 20, 2012 (KR) .................. 10-2012-0041404

(51) Int. Cl.
  *H05B 33/10* (2006.01)
  *B23K 26/20* (2014.01)
  *B23K 26/06* (2014.01)
  *H01L 51/52* (2006.01)

(52) U.S. Cl.
  CPC ............ *H05B 33/10* (2013.01); *B23K 26/0656* (2013.01); *B23K 26/206* (2013.01); *H01L 51/5246* (2013.01)

(58) Field of Classification Search
  CPC .................... B23K 26/0656; B23K 26/206
  USPC .............. 445/25, 66; 372/103; 156/272.8
  See application file for complete search history.

(56) References Cited

U.S. PATENT DOCUMENTS

| 2009/0086325 | A1 | 4/2009 | Liu et al. |
| 2009/0308105 | A1* | 12/2009 | Pastel et al. ................. 65/42 |
| 2010/0296291 | A1* | 11/2010 | Kang ................. 362/259 |
| 2011/0061884 | A1* | 3/2011 | Wang et al. ........... 174/50.5 |
| 2012/0000611 | A1* | 1/2012 | Lee et al. ........... 156/380.9 |

FOREIGN PATENT DOCUMENTS

| JP | 3374000 | 11/2002 |
| JP | 2006-106703 | 4/2006 |
| KR | 100744648 B1 | 7/2007 |

OTHER PUBLICATIONS

Patent Abstracts of Japan Publication No. 09-282707, cited Oct. 31, 1997 for JP3374000, 1pg.

* cited by examiner

*Primary Examiner* — Karabi Guharay
(74) *Attorney, Agent, or Firm* — Christie, Parker & Hale, LLP

(57) ABSTRACT

A laser sealing device includes a laser beam generation device for irradiating a laser beam, a shutter positioned on a beam path of the laser beam and for blocking a portion of the laser beam, and a substrate supporter for supporting a substrate on which a frit is formed, the frit being configured to be irradiated with the laser beam passing through the shutter, wherein the shutter has a circular aperture for transmitting the laser beam, and comprises a blocking portion defining a portion of the aperture.

18 Claims, 9 Drawing Sheets

APPARATUS AND METHOD FOR LASER SEALING

CROSS-REFERENCE TO RELATED APPLICATION

This application claims priority to and the benefit of Korean Patent Application No. 10-2012-0041404 filed in the Korean Intellectual Property Office on Apr. 20, 2012, the entire content of which is incorporated herein by reference.

BACKGROUND

1. Field

The described technology relates generally to a laser sealing device and a manufacturing method of an organic light emitting diode (OLED) display using the same.

2. Description of Related Art

An organic light emitting diode (OLED) display includes two electrodes and an organic light emitting element including an organic emission layer located between the two electrodes, wherein electrons injected from one electrode and holes injected from the other electrode are combined on the organic emission layer to form excitons that emit light while emitting energy.

The OLED display includes an element substrate formed with at least one organic light emitting element, an encapsulation substrate combined to the element substrate to encapsulate the organic light emitting element, and a frit to combine the element substrate and the encapsulation substrate.

If the element substrate is large, a frit having a wide width is used, which may require a uniform or near uniform temperature to melt the frit via a laser beam. If the temperature at which the frit is melted is not uniform, bubbles may be generated in areas where the temperature in the frit is higher, and/or an underlying metal wire may be damaged.

Accordingly, energy density of a center portion of the laser beam is decreased using a laser mask to achieve uniform temperature of the frit. However, the energy density of the center portion of the laser beam might not be easily decreased because of the high energy density at a periphery of the laser beam.

Also, for the uniform temperature of the frit, when the energy distribution of a circular flat top laser beam is changed from a Gaussian shape to a flat shape (the laser beam having a diameter that is larger than the width of the frit), the energy density in the laser beam irradiated to the frit center portion is larger than the energy density of the laser beam irradiated to the frit peripheral portion, such that the temperature of the frit center portion is higher than the temperature of the frit peripheral portion. In this case, the temperature of the center portion of the frit is increased such that bubbles may be generated, and when a metal wire is disposed under the frit, the metal wire might be expanded upward, or bulged, and the frit may be damaged.

Also, when using a quadrangle flat top laser beam to remove an imbalance of an incident energy density of the circular flat top laser beam, the energy in the frit peripheral portion, as compared with the frit center portion, is largely lost due to an edge effect, such that the temperature of the frit center portion is still high and the temperature of the frit is non-uniform. In this case, if the energy of the laser beam irradiated to the frit peripheral portion is increased to seal the frit peripheral portion, the metal wire might be damaged, and bubbles might be generated in the frit center portion, such that a micro crack may be generated.

The above information disclosed in this Background section is only for enhancement of understanding of the background of the described technology, and may contain information that does not form the prior art that is already known in this country to a person of ordinary skill in the art.

SUMMARY

Embodiments of the present invention provide a laser sealing device for suppressing damage to a metal wire under a frit, and suppressing bubble generation of a frit center portion, by forming a uniform temperature of a center portion and a peripheral portion of a frit to which a laser beam is irradiated, and a manufacturing method of an organic light emitting diode (OLED) display using the same.

A laser sealing device according to an exemplary embodiment includes a laser beam generation device for irradiating a laser beam, a shutter positioned on a beam path of the laser beam and for blocking a portion of the laser beam, and a substrate supporter for supporting a substrate on which a frit is formed, the frit being configured to be irradiated with the laser beam passing through the shutter, wherein the shutter has a circular aperture for transmitting the laser beam, and comprises a blocking portion defining a portion of the aperture.

The blocking portion may have a circular arc shape.

The blocking portion may have a trapezoidal shape.

The blocking portion may have a curved vertex.

A diameter of the aperture may be larger than a width of the frit.

A width of the blocking portion may be larger than the width of the frit.

The laser sealing device may further include an optical system at the beam path between the laser beam generation device and the substrate for controlling a shape of the laser beam.

The shutter may be positioned at the beam path between the optical system and the substrate.

The shutter may be a metallic material.

The shutter may be positioned at the beam path between the laser beam generation device and the optical system.

The laser beam generation device and the optical system may be coupled by a single fiber, and the shutter may be located at the single fiber.

The shutter may be a glass material.

The shutter may be positioned on the beam path inside the optical system.

The shutter may be positioned at a laser focusing portion inside the optical system.

The shutter may be a diffraction optical lens positioned at an outlet of the optical system.

A method of manufacturing an OLED display using a laser sealing device according to an exemplary embodiment includes mounting a substrate formed with a frit at a substrate supporter, positioning a shutter at the substrate, the shutter having a circular aperture and comprising a blocking portion, and irradiating a laser beam through the aperture to the frit.

A center axis of the blocking portion may be parallel to a scan direction of the laser beam.

The method may further include rotating the shutter when the laser beam reaches a corner portion of the substrate.

According to an exemplary embodiment, the blocking portion is formed at the aperture such that the energy density of the laser beam irradiated to the frit is easily controlled, and the temperature of the frit may be uniform.

Furthermore, discoloration of the frit center portion, generation of the bubble and the micro crack, and the damage to the metal wire under the frit may be suppressed.

Also, the center axis of the blocking portion is disposed parallel to the scan direction of the laser beam, and the energy density distribution of the laser beam is axis-symmetrical such that the laser beam is easily rotated in the corner portion.

DETAILED DESCRIPTION

Figure 1:
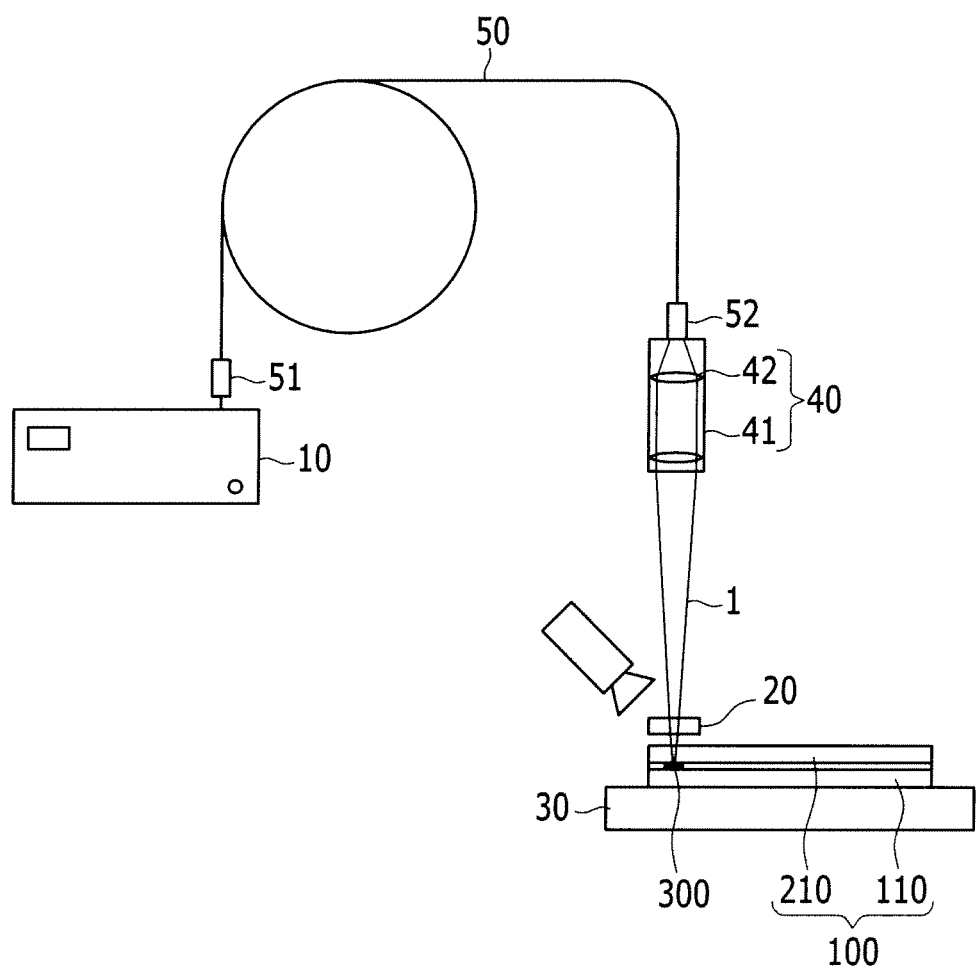
FIG. 1 is a schematic view of a laser sealing device according to a first exemplary embodiment.

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Like reference numerals designate like elements throughout the specification.

In addition, the size and the thickness of each element in the drawing may be random samples for better understanding and ease of description, and the present invention is not limited thereto.

Now, a laser sealing device according to the first exemplary embodiment will be described with reference to FIGS. 1 to 4.

Figure 2:
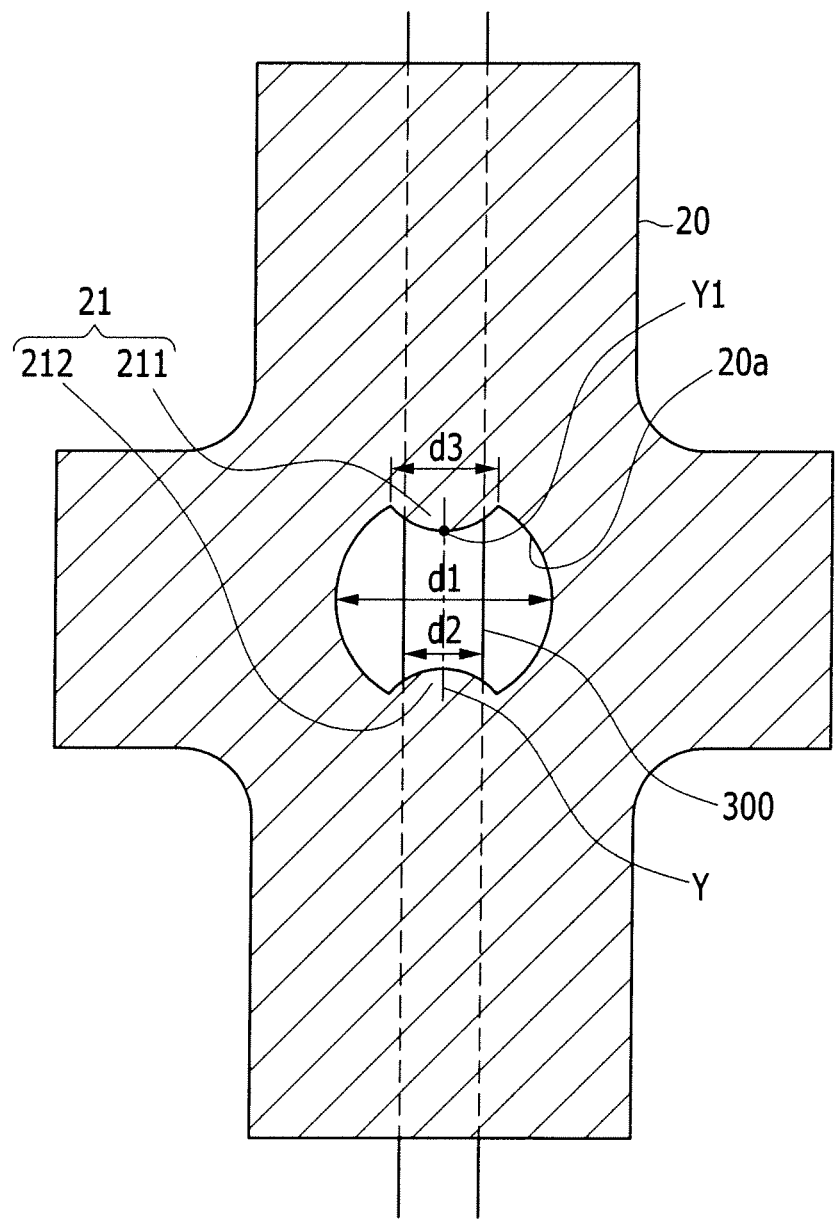
FIG. 2 is a top plan view of a shutter used in a laser sealing device according to the first exemplary embodiment.

FIG. 1 is a schematic view of a laser sealing device according to the first exemplary embodiment, and FIG. 2 is a top plan view of a shutter used in a laser sealing device according to the first exemplary embodiment.

As shown in FIGS. 1 and 2, the laser sealing device according to the first exemplary embodiment includes a laser beam generation device 10 irradiating a laser beam 1, a shutter 20 positioned on a beam path of the laser beam 1 and partially blocking the laser beam 1, a substrate supporter 30 mounted with a substrate 100 in which a frit 300, which is irradiated by the laser beam 1 passing through the shutter 20, is formed, and an optical system 40 positioned on the beam path between the laser beam generation device 10 and the substrate 100. Although the term "shutter" is used in the present application, shutters 20, 60, 70, and 80 may be a plate or other solid piece of material, according to embodiments of the present invention.

A single fiber 50 (e.g., an optic fiber) is installed between the laser beam generation device 10 and the optical system 40 such that a transmission of the laser beam 1 is substantially uniform. That is, a transmission of the laser beam 1 to the optical system 40 through the single fiber 50 has a substantially uniform cross-section. In the present embodiment, a beam coupler 51 and/or a beam collimator 52 to help the transmission of the laser beam 1 is installed in the single fiber 50.

The optical system 40 includes a cylindrically shaped lens barrel 41 and a plurality of lenses 42 interposed within the lens barrel 41, thereby controlling the shape of the laser beam 1. The laser beam 1 is circular and has a flat top due to the optical system 40. In the present exemplary embodiment, the circular laser beam 1 has a diameter of 3.5 mm.

The shutter 20 is positioned on the beam path between the optical system 40 and the substrate 100, and may be formed of a metallic material to be installed close to the substrate 100. This shutter 20 is positioned at a focusing portion of the optical system 40 thereby blocking a portion of the circular laser beam 1. When the shutter 20 is not close to the substrate 100, the portion of the laser beam 1 might not be blocked to form a desired shape by a diffraction phenomenon.

As shown in FIG. 2, the shutter 20 has a circular aperture 20a through which the laser beam 1 is passed, and an upper portion and a lower portion of the aperture 20a have (e.g., are formed by) a blocking portion 21. The blocking portion 21 has a circular arc shape and protrudes into the aperture 20a. An upper blocking portion 211 and a lower blocking portion 212 are substantially symmetrical with reference to the center of the aperture 20a.

The diameter d1 of the aperture 20a may be larger than the width d2 of the frit 300 and the width d3 of the blocking portion 21 may be larger than the width d2 of the frit 300. In the present embodiment, the width d3 of the blocking portion 21 may be about 10% larger than the width d2 of the frit 300, or more. Also, the width d3 of the blocking portion 21 may be smaller than the diameter of the aperture 20a. When the width d3 of the blocking portion 21 is not larger than the width d2 of the frit 300, the shape of the laser beam 1 may be irregular due to the diffraction phenomenon caused by the edge portion of the blocking portion 21.

When there is no blocking portion 21 in the aperture 20a, the energy density of the center portion of the laser beam 1 irradiated to the frit 300 is larger than the energy density of the peripheral portion of the laser beam 1 irradiated to the frit 300, however, as in the present exemplary embodiment, when the center portion of the laser beam 1 irradiated to the frit 300 through the aperture 20a is blocked by the blocking portion 21, the energy density of the center portion of the laser beam 1 irradiated to the frit 300 is controlled to be the same as the energy density of the peripheral portion of the laser beam 1 irradiated to the frit 300. Accordingly, the center portion of the frit 300 and the peripheral portion of the frit 300 irradiated with the laser beam 1 have a substantially uniform temperature such that bubble generation in the center portion of the frit 300, as well as damage to the metal wire positioned under the frit 300, may be reduced or prevented.

Figure 3:
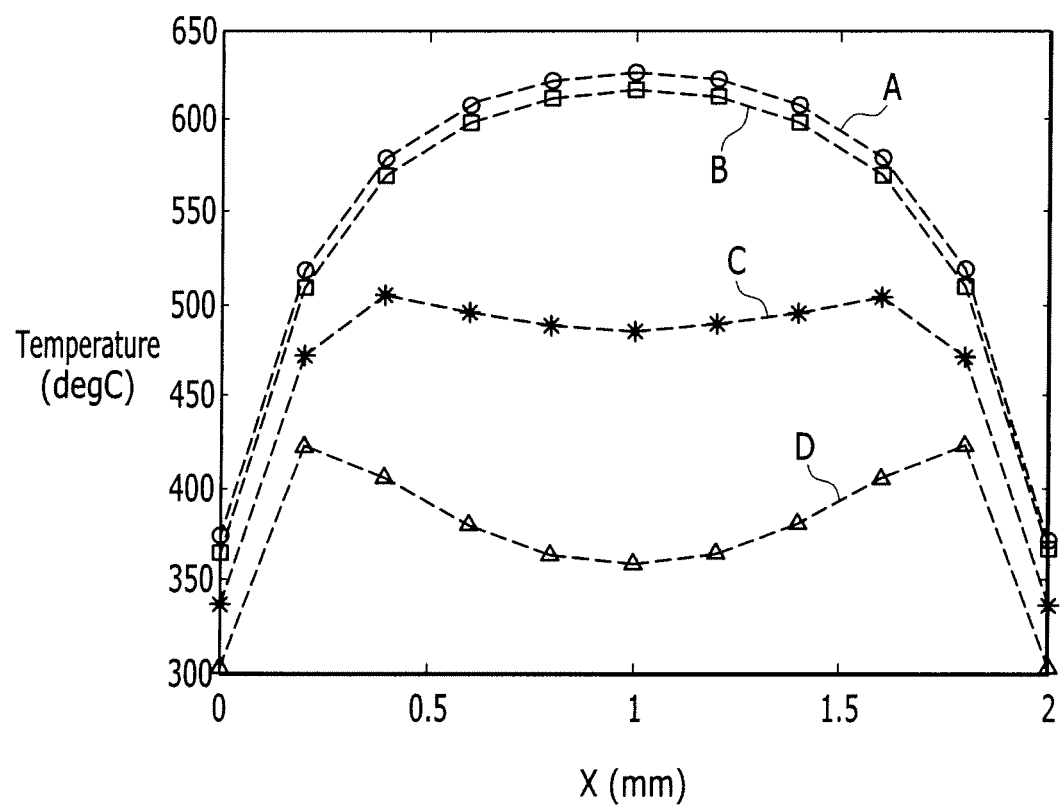
FIG. 3 is a graph of a temperature distribution of a frit positioned corresponding to an upper blocking portion when performing a sealing process using a laser sealing device according to the first exemplary embodiment.
Figure 4:
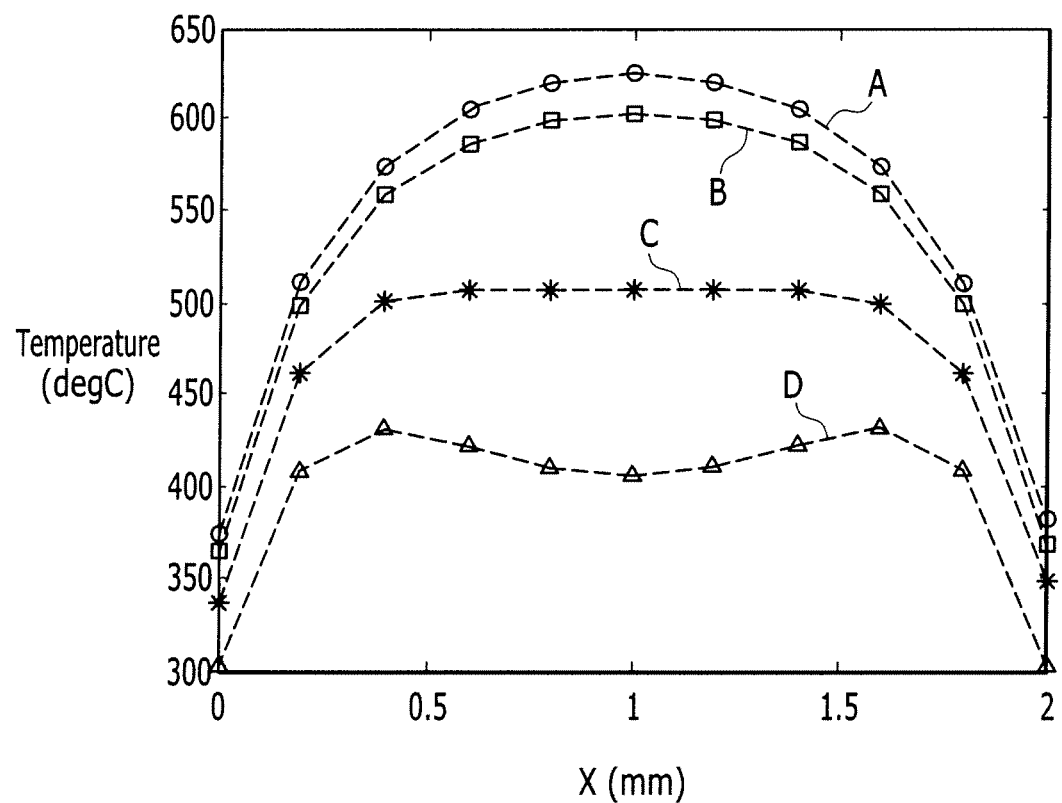
FIG. 4 is a graph of a temperature distribution of a frit positioned corresponding to a lower blocking portion when performing a sealing process using a laser sealing device according to the first exemplary embodiment.

FIG. 3 is a graph of a temperature distribution of a frit position with respect to an upper blocking portion when performing a sealing process using a laser sealing device according to the first exemplary embodiment, and FIG. 4 is a graph of a temperature distribution of a frit position with respect to a lower blocking portion when performing a sealing process using a laser sealing device according to the first exemplary embodiment.

In FIGS. 3 and 4, line A shows a temperature distribution of a frit 300 caused by a laser beam passing through an aperture 20a in which a blocking portion is not formed, line B shows a temperature distribution of a frit 300 caused by a laser beam passing through an aperture 20a having a crossing point Y1, where a blocking portion 21 meets with a vertical center axis Y of an aperture 20a at 20% of a radius of the aperture 20a, a line C shows a temperature distribution of a frit 300 caused by a laser beam passing through an aperture 20a when the crossing point Y1 of the blocking portion 21 is at 40% of the radius of the aperture 20a, and a line D shows a temperature distribution of a frit 300 by a laser beam passing through an aperture 20a when the crossing point Y1 of the blocking portion 21 is at 60% of the radius of the aperture 20a.

As shown in FIGS. 3 and 4, when the crossing point Y1 of the blocking portion 21 is positioned at more than 30% of the radius of the aperture 20a, the temperature of the center portion of the frit 300 caused by the laser beam 1 is decreased such that the center portion of the frit 300 and the peripheral portion of the frit 300 have a substantially uniform temperature.

A manufacturing method of an organic light emitting diode (OLED) display using the laser sealing device according to the first exemplary embodiment will be described with reference to FIGS. 1 and 2.

As shown in FIGS. 1 and 2, in the manufacturing method of an OLED display using the laser sealing device according to the first exemplary embodiment, firstly, a substrate 100 formed with a frit 300 is mounted on a substrate supporter 30. That is, to assemble an element substrate 110 and an encapsulation substrate 210, the frit 300 is made as a paste and is coated with a reference thickness (e.g., a predetermined thickness) at a position to be assembled on the element substrate 110. Next, the frit 300 coated on the element substrate 110 is pre-baked to remove moisture and a binder component in the frit 300, and the encapsulation substrate 210 is aligned on the element substrate 110.

Next, a laser sealing device including a shutter 20 having a circular aperture 20a for passing a laser beam 1 and including an upper blocking portion 211 and a lower blocking portion 212 is positioned on the substrate 100.

Next, the laser beam 1 is irradiated and is changed, or shaped, by the blocking portion 21 of the shutter 20 to be irradiated and scanned to the frit 300. As described above, a portion coated with the frit 300 is locally heated by the laser beam 1 to melt the frit 300 thereby performing a sealing process of assembling (combining) the element substrate 110 and the encapsulation substrate 210. At this time, to avoid generation of the bubble in the center portion of the frit 300, a center axis Y of the blocking portion 21, that is, the vertical center axis Y of the aperture 20a, is parallel to the scan direction of the laser beam 1.

When the aperture 20a does not have the blocking portion 21, the energy density of the center portion of the laser beam 1 irradiated to the frit 300 is larger than the energy density of the peripheral portion of the laser beam 1 irradiated to the frit 300. However, as with the present exemplary embodiment, when the center portion of the laser beam 1 is blocked by the blocking portion 21, the energy density of the center portion of the laser beam 1 irradiated to the frit 300 is controlled to be the same as the energy density of the peripheral portion of the laser beam 1 irradiated to the frit 300. Accordingly, the center portion of the frit 300 and the peripheral portion of the frit 300 irradiated with the laser beam 1 have a substantially uniform temperature, such that the bubble generation in the center portion of the frit 300, as well as damage to the metal wire positioned under the frit 300, may be reduced or prevented.

When the laser beam 1 performs in a corner portion of the substrate 100, the shutter 20 is rotated. At this time, the center axis Y of the blocking portion 21 is parallel to the scan direction of the laser beam 1, and the energy density distribution of the laser beam 1 is substantially symmetrical, such that the rotation is easy in the corner portion. Accordingly, temperature of the center portion of the frit 300 and the peripheral portion of the frit 300 irradiated with the laser beam 1 is substantially uniform, such that the bubble generation in the center portion of the frit 300, and damage to the metal wire positioned under the frit 300, may be reduced or prevented.

A second exemplary embodiment and a third exemplary embodiment having different shapes from the blocking portion of the first exemplary embodiment are possible.

Figure 5:
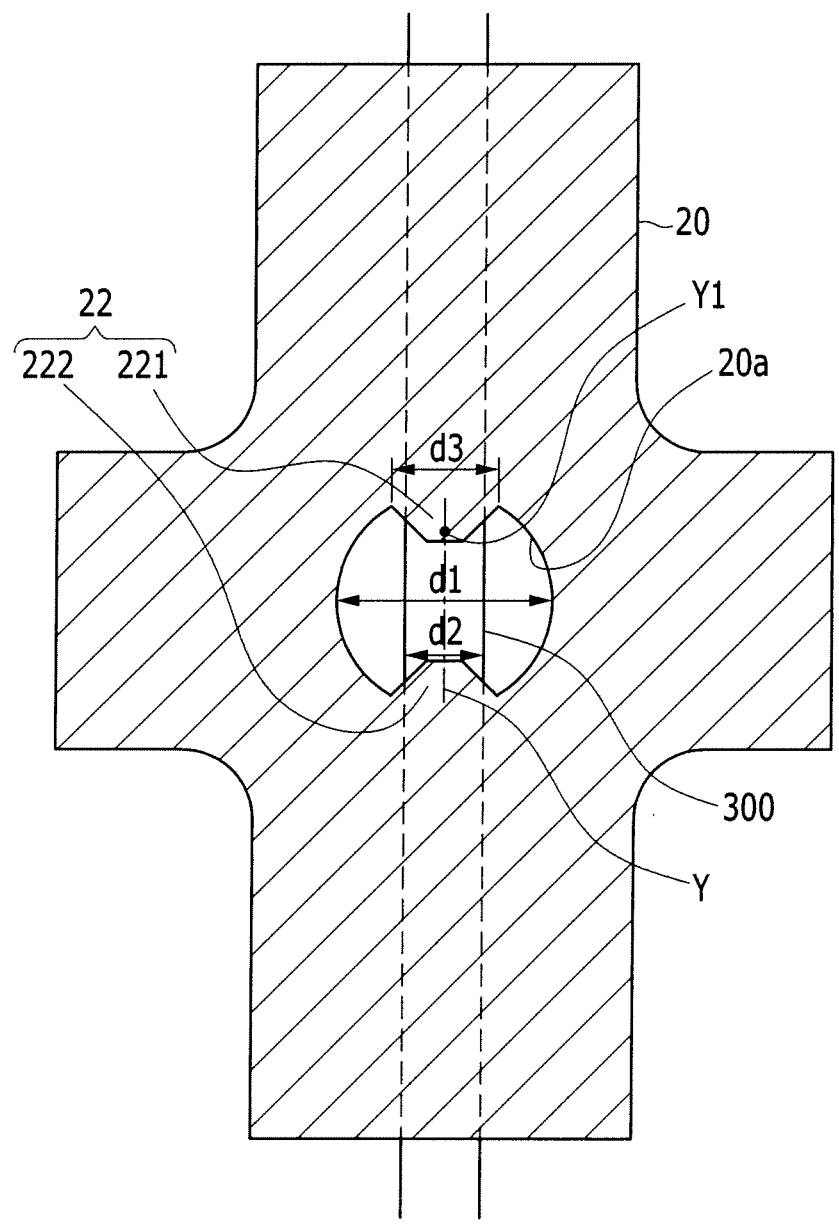
FIG. 5 is a top plan view of a shutter used in a laser sealing device according to a second exemplary embodiment.
Figure 6:
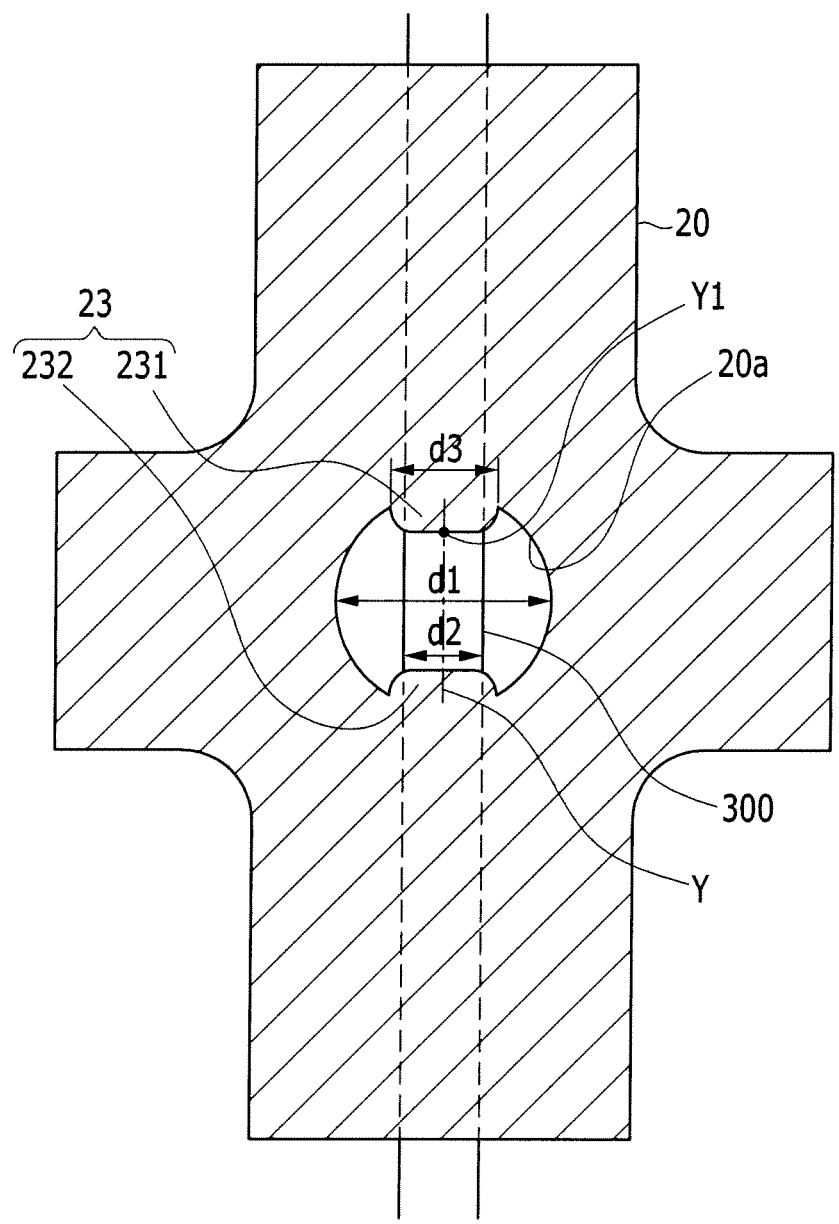
FIG. 6 is a top plan view of a shutter used in a laser sealing device according to a third exemplary embodiment.

FIG. 5 is a top plan view of a shutter used in a laser sealing device according to the second exemplary embodiment, and FIG. 6 is a top plan view of a shutter used in a laser sealing device according to the third exemplary embodiment.

The second exemplary embodiment and the third exemplary embodiment are substantially equivalent to the first exemplary embodiment shown in FIGS. 1 and 2, with the exception of the shape of the blocking portion. Accordingly, repeated description is omitted.

As shown in FIG. 5, the shutter 20 has a circular aperture 20a passing with the laser beam 1, and the upper and lower portions of the aperture 20a have a blocking portion 22 having a trapezoidal shape and protrudes to the aperture 20a. An upper blocking portion 221 and a lower blocking portion 222 are substantially symmetrical with respect to a horizontal axis of the aperture 20a.

The diameter d1 of the aperture 20a is larger than the width d2 of the frit 300, and the width d3 of the blocking portion 22 may be larger than the width d2 of the frit 300. In the present embodiment, the width d3 of the blocking portion 22 may be 10% (or more) larger than the width d2 of the frit 300. Also, the width d3 of the blocking portion 22 may be smaller than the diameter d1 of the aperture 20a. When the width d3 of the blocking portion 22 is not larger than the width d2 of the frit 300, the shape of the laser beam 1 may be irregular due to the diffraction phenomenon of the edge portion of the blocking portion 22.

Also, as shown in FIG. 6, the shutter 20 of the third embodiment includes the circular aperture 20a for passing the laser beam 1, and the upper and lower portions of the aperture 20a have a blocking portion 23. The blocking portion 23 has a trapezoidal shape having a curved vertex, and protrudes into the aperture 20a. An upper blocking portion 231 and a lower blocking portion 232 are substantially symmetrical with reference to the horizontal axis of the aperture 20a.

In the present embodiment, the diameter d1 of the aperture 20a is larger than the width d2 of the frit 300, and the width d3 of the blocking portion 23 is also larger than the width d2 of the frit 300. In the present embodiment, the width d3 of the blocking portion 23 may be 10% larger than the width d2 of the frit 300 (or larger). Also, the width d3 of the blocking portion 23 may be smaller than the diameter of the aperture 20a.

A fourth exemplary embodiment, in which the shutter is differently located between the laser beam generation device and the optical system, is possible, differing from the shutter of the first exemplary embodiment, which is positioned on the beam path between the optical system and the substrate.

Figure 7:
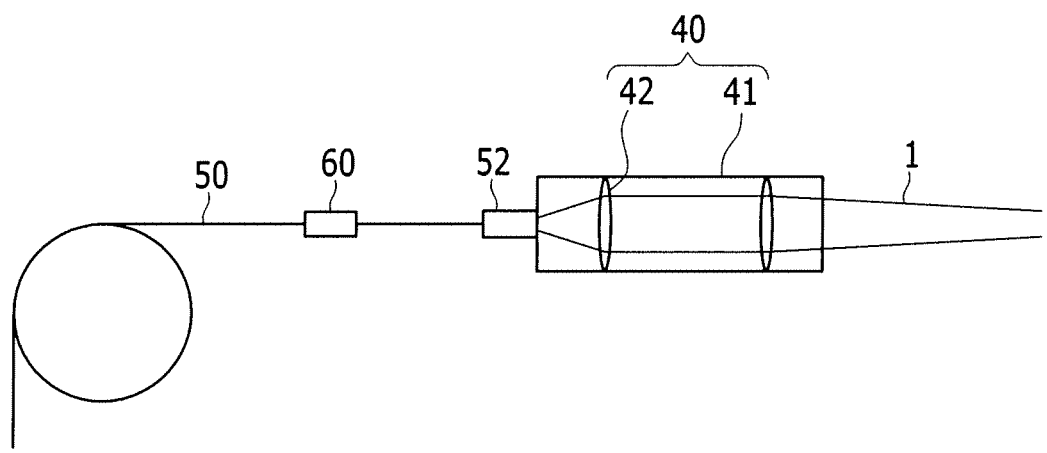
FIG. 7 is an enlarged view of a shutter and an optical system of a laser sealing device according to a fourth exemplary embodiment.

FIG. 7 is an enlarged view of a shutter and an optical system of a laser sealing device according to the fourth exemplary embodiment, which is substantially equivalent to the first exemplary embodiment shown in FIGS. 1 and 2 with the exception of the shutter, and repeated description is omitted.

As shown in FIG. 7, a shutter 60 of the laser sealing device according to the fourth exemplary embodiment is positioned on the beam path between the laser beam generation device 10 and the optical system 40, and may be made of a glass material.

In detail, the shutter 60 is installed as a single fiber 50 connecting the laser beam generation device 10 and the optical system 40, and the shutter 60 may have blocking portions 21, 22, and 23 described in the first exemplary embodiment to the third exemplary embodiment. The single fiber 50 uniformly transmits the circular laser beam 1 generated in the laser beam generation device 10 and the shutter 60 of the glass material is installed in the single fiber 50, thereby obtaining the clean laser beam 1 having high efficiency.

The shutter 60 is rotated while maintaining the optical axis of the laser beam 1 as to avoid twisting when sealing the corner portion.

A fifth exemplary embodiment, in which the shutter is disposed inside the optical system, is possible, differing from the shutter of the first exemplary embodiment, which is positioned on the beam path between the optical system and the substrate.

Figure 8:
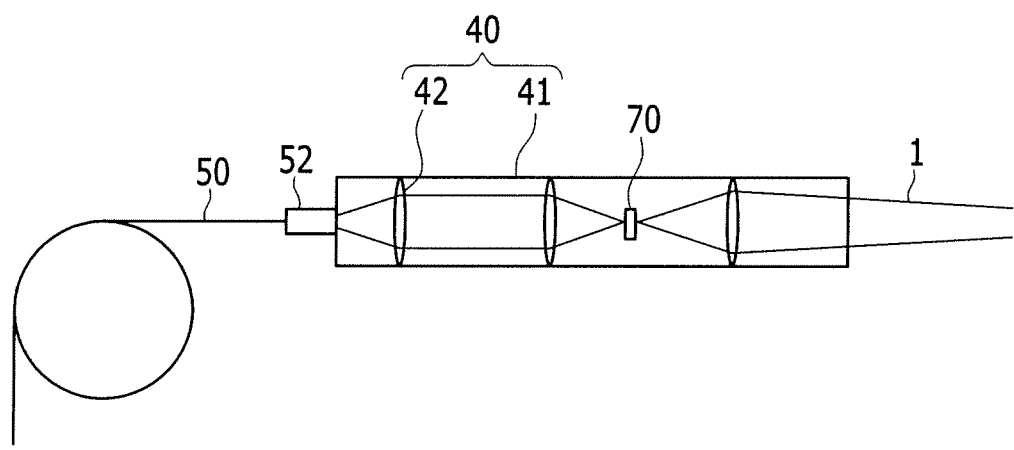
FIG. 8 is an enlarged view of a shutter and an optical system of a laser sealing device according to a fifth exemplary embodiment.

FIG. 8 is an enlarged view of a shutter and an optical system of a laser sealing device according to the fifth exemplary embodiment, which is substantially equivalent to the first exemplary embodiment shown in FIGS. 1 and 2, except for the shutter, and repeated description is omitted.

As shown in FIG. 8, a shutter 70 of the laser sealing device according to the fifth exemplary embodiment may be positioned inside the optical system 40.

In detail, the optical system 40 includes a plurality of lenses 42, and the shutter 70 is positioned at the focusing portion of one of the lenses 42. The optical system 40 shown in FIG. 8 includes three lenses 42, and the shutter 70 is positioned at the focusing portion of the second lens. The shutter 70 may have the blocking portions 21, 22, and 23 described in the first to third exemplary embodiments. Accordingly, the laser beam 1 having the shape of the shutter 70 is formed at the frit 300.

For the shutter 70 of the present embodiment, the blocking portions 21, 22, and 23 are formed by depositing a blocking metal on quartz, and the blocking metal must be a material that is robust against a high intensity of the laser beam 1 in the focusing portion of the second lens. The blocking metal may be tungsten when the intensity of the laser beam 1 is in a range of 40 to 100 W. Also, the shutter 70 may be formed by directly laser-processing the blocking metal, and may be installed to be rotated when sealing the corner portion.

The fifth exemplary embodiment of a diffraction optical lens, in which the shutter is disposed at an outlet of the optical system, is possible, and is different from the shutter of the first exemplary embodiment positioned on the beam path between the optical system and the substrate.

Figure 9:
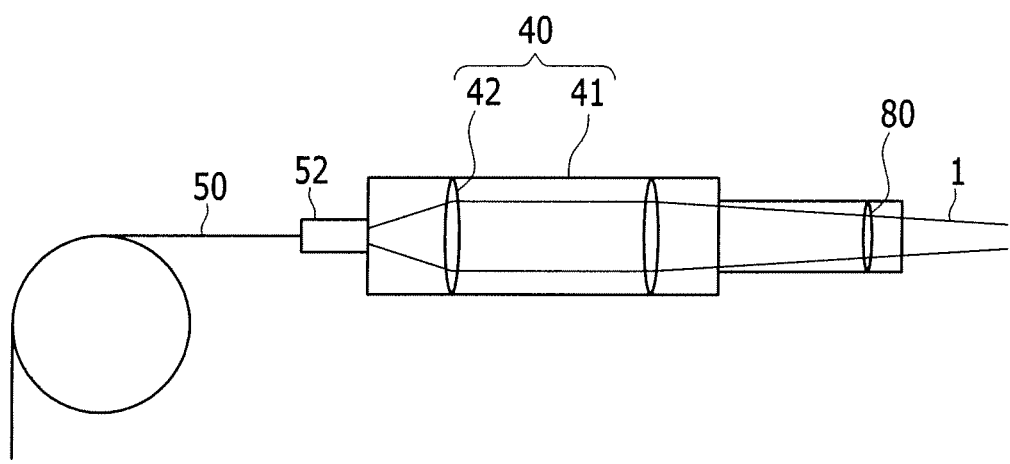
FIG. 9 is an enlarged view of a shutter and an optical system of a laser sealing device according to a sixth exemplary embodiment.

FIG. 9 is an enlarged view of a shutter and an optical system of a laser sealing device according to a sixth exemplary embodiment, which is substantially equivalent to the first exemplary embodiment shown in FIGS. 1 and 2, with the exception of the shutter, and repeated description is omitted.

As shown in FIG. 9, a shutter 80 of the laser sealing device according to the sixth exemplary embodiment is positioned at the outlet of the optical system 40, and may be a diffraction optical lens (DOE).

The shutter 80 is the diffraction optical lens such that the circular laser beam 1 is changed into the laser beam 1 of a different shape.

In this case, the first diffraction image is formed at an optical axis, and after the zero diffraction image is incident to be twisted by 2 to 3 degrees, if the laser beam power is more than 100 mW, the blocking is performed by using a mask, and a higher order diffraction image is processed as black noise.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and their equivalents.

SOME OF THE REFERENCE CHARACTERS

| 10: laser generation device | 20, 60, 70, 80: shutter |
|---|---|
| 21, 22, 23: blocking portion | 30: substrate supporter |
| 40: optical system | 50: single fiber |

What is claimed is:

1. A laser sealing device comprising:
a laser beam generation device for irradiating a laser beam;
a shutter positioned on a beam path of the laser beam and for blocking a portion of the laser beam; and
a substrate supporter for supporting a substrate on which a frit is formed, the fit being configured to be irradiated with the laser beam passing through the shutter,
wherein the shutter has a circular aperture for transmitting the laser beam, and comprises a blocking portion having a convex edge blocking a portion of the aperture.

2. The laser sealing device of claim 1, wherein the blocking portion has a circular arc shape.

3. The laser sealing device of claim 1, wherein the blocking portion has a trapezoidal shape.

4. The laser sealing device of claim 3, wherein the blocking portion has a curved vertex.

5. The laser sealing device of claim 1, wherein a diameter of the aperture is larger than a width of the frit.

6. The laser sealing device of claim 5, wherein a width of the blocking portion is larger than the width of the frit.

7. The laser sealing device of claim 1, further comprising an optical system at the beam path between the laser beam generation device and the substrate for controlling a shape of the laser beam.

8. The laser sealing device of claim 7, wherein the shutter is positioned at the beam path between the optical system and the substrate.

9. The laser sealing device of claim 8, wherein the shutter is a metallic material.

10. The laser sealing device of claim 7, wherein the shutter is positioned at the beam path between the laser beam generation device and the optical system.

11. The laser sealing device of claim 10, wherein the laser beam generation device and the optical system are coupled by a single fiber, and
wherein the shutter is located at the single fiber.

12. The laser sealing device of claim 11, wherein the shutter is a glass material.

13. The laser sealing device of claim 7, wherein the shutter is positioned on the beam path inside the optical system.

14. The laser sealing device of claim 13, wherein the shutter is positioned at a laser focusing portion inside the optical system.

15. The laser sealing device of claim 7, wherein the shutter is a diffraction optical lens positioned at an outlet of the optical system.

16. A method of manufacturing an organic light emitting diode (OLED) display using a laser sealing device, comprising:
  mounting a substrate formed with a frit at a substrate supporter;
  positioning a shutter at the substrate, the shutter having a circular aperture and comprising a blocking portion having a convex edge blocking a portion of the aperture; and
  irradiating a laser beam through the aperture to the frit.

17. The method of claim 16, wherein a center axis of the blocking portion is parallel to a scan direction of the laser beam.

18. The method of claim 17, further comprising rotating the shutter when the laser beam reaches a corner portion of the substrate.

\* \* \* \* \*